United States Patent [19]

Crozier et al.

[11] Patent Number: 6,145,111
[45] Date of Patent: Nov. 7, 2000

[54] HIGH-PERFORMANCE LOW-COMPLEXITY ERROR-CORRECTING CODES

[75] Inventors: Stewart Crozier, Kanata; Andrew Hunt, Ottawa; John Lodge, Kanata, all of Canada

[73] Assignee: Her Majesty the Queen in right of Canada, as represented by the Minister of Industry through Communications Research Centre, Ottawa, Canada

[21] Appl. No.: 09/134,152

[22] Filed: Aug. 14, 1998

Related U.S. Application Data

[60] Provisional application No. 60/055,611, Aug. 14, 1997.

[51] Int. Cl.$^7$ ................................................. G11B 20/18
[52] U.S. Cl. ......................... 714/755; 714/762; 714/804
[58] Field of Search .................................. 714/752, 754, 714/755, 762, 804

[56] References Cited

U.S. PATENT DOCUMENTS

| | | | |
|---|---|---|---|
| 5,271,012 | 12/1993 | Blaum et al. | 371/101 |
| 5,459,853 | 10/1995 | Best et al. | 395/441 |
| 5,513,192 | 4/1996 | Janku et al. | 371/50.1 |
| 5,537,567 | 7/1996 | Galbraith et al. | 395/441 |
| 5,579,475 | 11/1996 | Blaum et al. | 395/182.05 |
| 5,968,200 | 10/1999 | Amrany | 714/786 |
| 6,047,395 | 4/2000 | Zook | 714/756 |
| 6,048,090 | 4/2000 | Zook | 714/755 |

*Primary Examiner*—Albert De Cady
*Assistant Examiner*—Esaw Abraham
*Attorney, Agent, or Firm*—Freedman & Associates

[57] ABSTRACT

A method of encoding data is described herein. According to the method, source data elements are coded using one or more product codes having a common component code. The resulting one or more primary product codewords consist of a plurality of first codewords of the common component code. One or more first sets of codewords of the common component code are assembled such that each of the first sets comprises two or more distinct first codewords forming part of a same primary product codeword. Each of the codewords of each of the first sets is codeword-mapped to a second codeword of the common component code using a one-to-one codeword-mapping. One or more second sets of second codewords are provided, where each second set corresponds to a first set of codewords. The codeword-mapping includes re-ordering, according to a known interleaving pattern, the symbols within a codeword. The codeword-mappings are such that if all of the codewords of a first set are from a same primary product codeword, then some codeword-mappings applied to the codewords of the first set are different, and if two or more repetitions of a same codeword are included in a single first set, then the codeword-mappings applied to those repetitions are different. Each set of second codewords is coded using a systematic code so as to generate a secondary product codeword for a product code having as component codes the common component code and the systematic code. Then, the primary product codewords and the non-systematic portion of the secondary product codewords are provided as encoded output data.

20 Claims, 2 Drawing Sheets

HIGH-PERFORMANCE LOW-COMPLEXITY ERROR-CORRECTING CODES

This appln claims the benefit of U.S. Provisional Ser. No. 60/055,611 filed Aug. 14, 1997.

The present application is related to co-pending application entitled "Method Of Enhanced Max-Log-A Posteriori Probability Processing" filed on Aug. 14, 1998. The co-pending application is herein incorporated by reference.

FIELD OF THE INVENTION

The invention relates generally to methods of data encoding and more particularly to a method of encoding data for error correction.

BACKGROUND OF THE INVENTION

An error-correction code is a method of coding information messages in a manner that incorporates redundancy. By exploiting this redundancy, a decoder for an error-correcting code is able to provide error-correcting functionality. Of course, redundancy as incorporated within error-correction codes does not necessarily imply an exact duplication of data.

Herein, the term error-correction code (or code), is a mapping of information messages to codewords, each codeword being an ordered collection of symbols from some finite symbol set. Each codeword of a code has the same codeword length. The codeword length is the number of symbols in a codeword. The codeword length may be infinite. A symbol set is a collection of distinct identifiers, such as $\{0\ 1\}$ or $\{1\ \beta\beta^2\beta^3\}$. The codewords of a code form a proper subset of all possible ordered collections of symbols from the symbol set—the collections of a size equal to the codeword length. Some ordered collections of symbols from the symbol set are codewords of the code, and others are not, and this is what provides the required redundancy.

Typically, a set of constraints determines which ordered collections of symbols are codewords of a code and which are not. The constraints are expressed in terms of one or more operators that are associated with the symbol set. Highly structured constraints are usually desirable to enable simple encoding and decoding of a code. The constraints are usually defined over groups or fields, which have well-known mathematical properties.

A code where the information message is part of the codeword itself is called a systematic code. That is, with a systematic code, the information messages are expressed in terms of the same symbol set used for the codewords themselves, and the symbols of the information message appear within the associated codeword, in some arbitrary but fixed placement pattern.

A code with a finite codeword length is called a block code.

A cyclic code is a code where any cyclic shift of a codeword is also a codeword. A cyclic code, however, is not limited to block codes.

A quasi-cyclic code is a code where some, but not all, cyclic shifts of a codeword are codewords. An example of a quasi-cyclic code is a tail-biting block convolutional code. Such a code is well known in the art. Techniques used with cyclic codes are often applicable to quasi-cyclic codes as long as the distinction therebetween is accounted for.

A binary code is a code having symbols that are bits (i.e. 0 and 1).

A product code is a code constructed from two or more codes, called component codes of the product code, which are combined in an orthogonal manner. Specifically, an N-dimensional product code is a code composed of N component codes, where each codeword of the product code can be represented as an N-dimensional array of symbols such that, for any selected dimension and any set of valid indices for other dimensions, the ordered collection of symbols determined by moving along the selected dimension while keeping the indices of the other dimensions fixed, is a codeword of the component code associated with the selected dimension. Note that a component code of a product code may itself be a product code.

Parity is a well known method of coding. Using "even-parity" with bits a constraint exists that a set of symbols sums modulo-2 to 0. For example, a set of message information bits $\{1\ 0\}$ are encoded as the codeword $\{1\ 0\ 1\}$; a set of message information bits $\{1\ 1\}$ are encoded as the codeword $\{1\ 1\ 0\}$. Parity is well known in the art. As a simple example of a product code, consider a two-dimensional binary product code where each of two component codes are "even-parity" codes with a codeword length of 3. The following collection of bits is a valid codeword for such a product code:

1 0 1
0 1 1
1 1 0

Observe that each row and each column has even parity. This product code has only 16 distinct codewords. Each codeword has a codeword length of 9. It is apparent that without constraints, there are $2^9$ (512) possible ordered collections of bits of length 9.

In order to improve error correcting capability of existing product codes, further dimensions are added to the product code. For example, the two-dimensional product code shown above has a minimum Hamming distance of 4—a minimum of 4 bits must be flipped within a product codeword to produce another valid product codeword. By adding a third dimension of even-parity encoding with codeword length of 3, the minimum Hamming distance is increased to 8. This larger Hamming distance is indicative of more powerful error-correcting capabilities; however, in order to achieve this increased error-correcting capability, 19 of 27 bits within the product codeword are devoted to parity information. In the two-dimensional product code shown above, nearly half the bits are information, whereas in the three-dimensional product code, less than $\frac{1}{3}$ of the bits is information bits. In this example, the percentage of information bits within a codeword drops significantly when an additional dimension is added to the product code. In order to increase this percentage, an increased amount of information bits is required; this is also a significant limitation.

SUMMARY OF INVENTION

Product coding is a generally-known method of coding source data that provides good error-correction capability, for which efficient and effective decoding methods exist that are based on iterative processing. A limitation of conventional product coding techniques, however, is that each increase in the number of dimensions of a product code is accompanied by a significant rise in the block size—a measure of the amount of message information associated with each codeword, and/or a significant drop in the code rate—a measure of the overhead of a code. The present invention improves upon existing product coding methods, providing a coding method that has greater error-correcting capability than standard product codes, for a given block size and code rate, while still permitting efficient and effective decoding using iterative decoding methods.

In accordance with the invention there is provided a method for error-correction coding of source data elements. According to the method the source data elements are coded using one or more product codes having a common component code, to provide one or more primary product codewords, each of the primary product codewords consisting of multiple first codewords of the common component code. One or more first sets of codewords of the common component code are then assembled. Each of said first sets contain two or more distinct first codewords forming part of a same primary product codeword. Codeword-mapping of each of the codewords of each of the first sets to a second codeword of the common component code using a one-to-one codeword-mapping is performed, providing one or more second sets of second codewords, each second set corresponding to a first set of codewords. Codeword-mappings of each codeword of a first set include the step of: re-ordering, according to a known interleaving pattern, the symbols within a codeword. The codeword-mappings are performed such that if all of the codewords of a first set are from a same primary product codeword, then some codeword-mappings applied to the codewords of the first set are different, and if two or more repetitions of a same codeword are included in a single first set, then the codeword-mappings applied to those repetitions are different. Each set of second codewords is coded using a systematic code so as to generate a secondary product codeword for a product code having as component codes the common component code and the systematic code. Encoded output data comprising the primary codewords and the non-systematic portion of the secondary product codewords are provided.

BRIEF DESCRIPTION OF FIGURES

Exemplary embodiments of the invention will now be described with reference to the following figures.

DETAILED DESCRIPTION OF THE INVENTION

Terms

Figure 1:
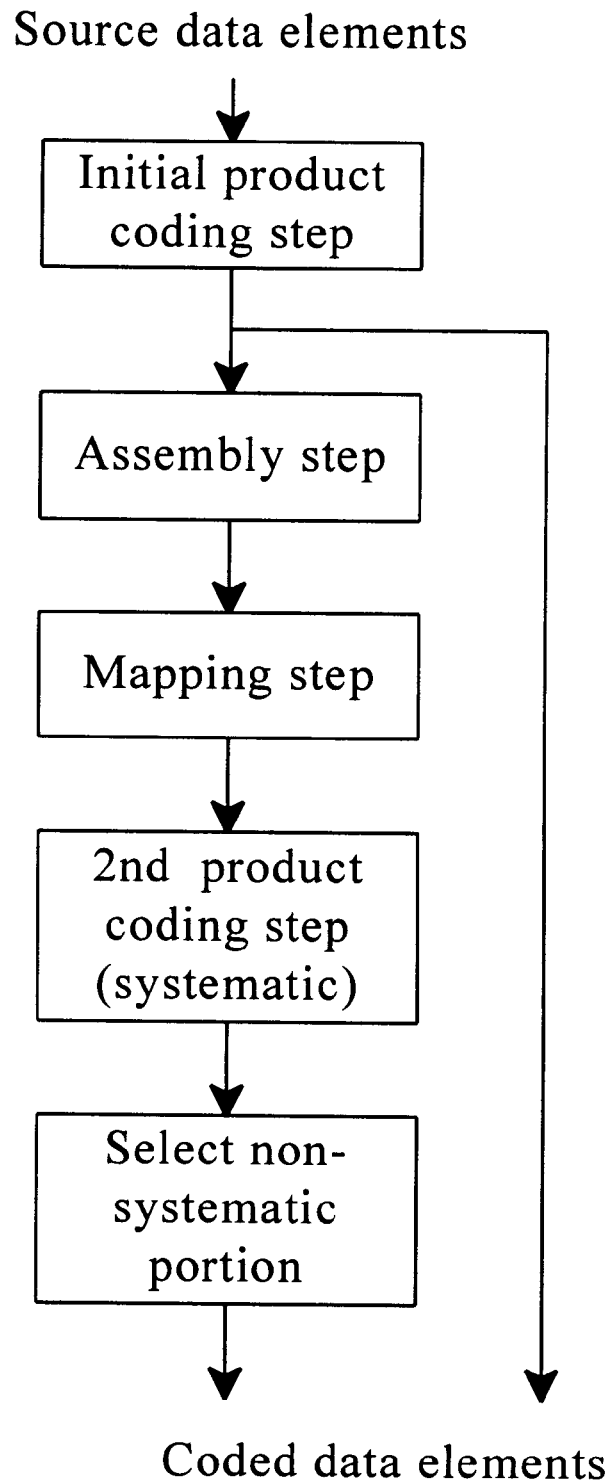
FIG. 1 is a simplified block diagram of a method according to the invention; and, FIG. 2 is a simplified data flow diagram of a method according to the invention.

The following terms are used herein and have the definitions set out below. These are not terms currently of general use in the art.

A product codeword is a codeword of a product code (e.g. 9 bit codeword shown above).

A component codeword is a codeword of a component code of a product code.

If a codeword of a product code having one or more component codes that are cyclic codes is cyclically shifted, in a one-dimensional manner, along a dimension associated with a cyclic component code, the result is another codeword of the product code. That is, a one-dimensional cyclic shift of a product codeword, along a dimension associated with a cyclic component code, produces another valid product codeword. Such a one-dimensional cyclic shift of a product codeword, along a dimension associated with a cyclic component code, is referred to as a rolling of the product codeword. When a product codeword is rolled along all of the dimensions having cyclic component codes, with any ordering of the rolling dimensions and any amounts of rolling, the result is a valid product codeword.

To clarify the concept of rolling, consider an N-dimensional product code having one or more cyclic component codes. A rolling of a codeword of such a code along a dimension associated with a cyclic component code amounts to a cyclic shift of N-1 dimensional arrays of symbols along the dimension of rolling. That is, through the rolling process, the N-1 dimensional arrays of symbols along the dimension of rolling remain intact.

A sum-to-identity code is a block code where the "addition" of the symbols making up any given codeword sums to an "identity" symbol. To have a "sum-to-identity" code, the symbol set of the code has an associated operator, called "addition", defined over the members of the symbol set, with one of the symbols in the symbol set being the "identity element" for the addition operator. Further, this addition operator must be commutative—the operator is insensitive to the ordering of the operands (i.e. a+b=b+a). In mathematical terms, the symbol set together with the addition operator form an "abelian group". An "even-parity" code—a code where the symbols are bits and where there must be an even number of '1' bits in each codeword—is a simple example of a sum-to-identity code. Any re-arrangement of the symbols making up a codeword of a sum-to-identity code produces another codeword, since the result of any summation is not affected by the order of summation. All sum-to-identity codes are cyclic codes, but cyclic codes are not necessarily sum-to-identity codes.

For a codeword of a product code having one or more component codes that are sum-to-identity codes, any re-arrangement of the N-1 dimensional arrays of symbols along a dimension associated with a sum-to-identity component code produces another valid codeword of the product code. Such a one-dimensional re-arrangement of a product codeword, along a dimension associated with a sum-to-identity component code, is referred to herein as a shuffling of the product codeword. A product codeword shuffled along all of the dimensions having sum-to-identity component codes, with any ordering of the shuffling dimensions and any shuffling pattern for each dimension, results in a valid product codeword. For example, rolling is a special case of shuffling.

Exemplary Embodiments

Figure 2:
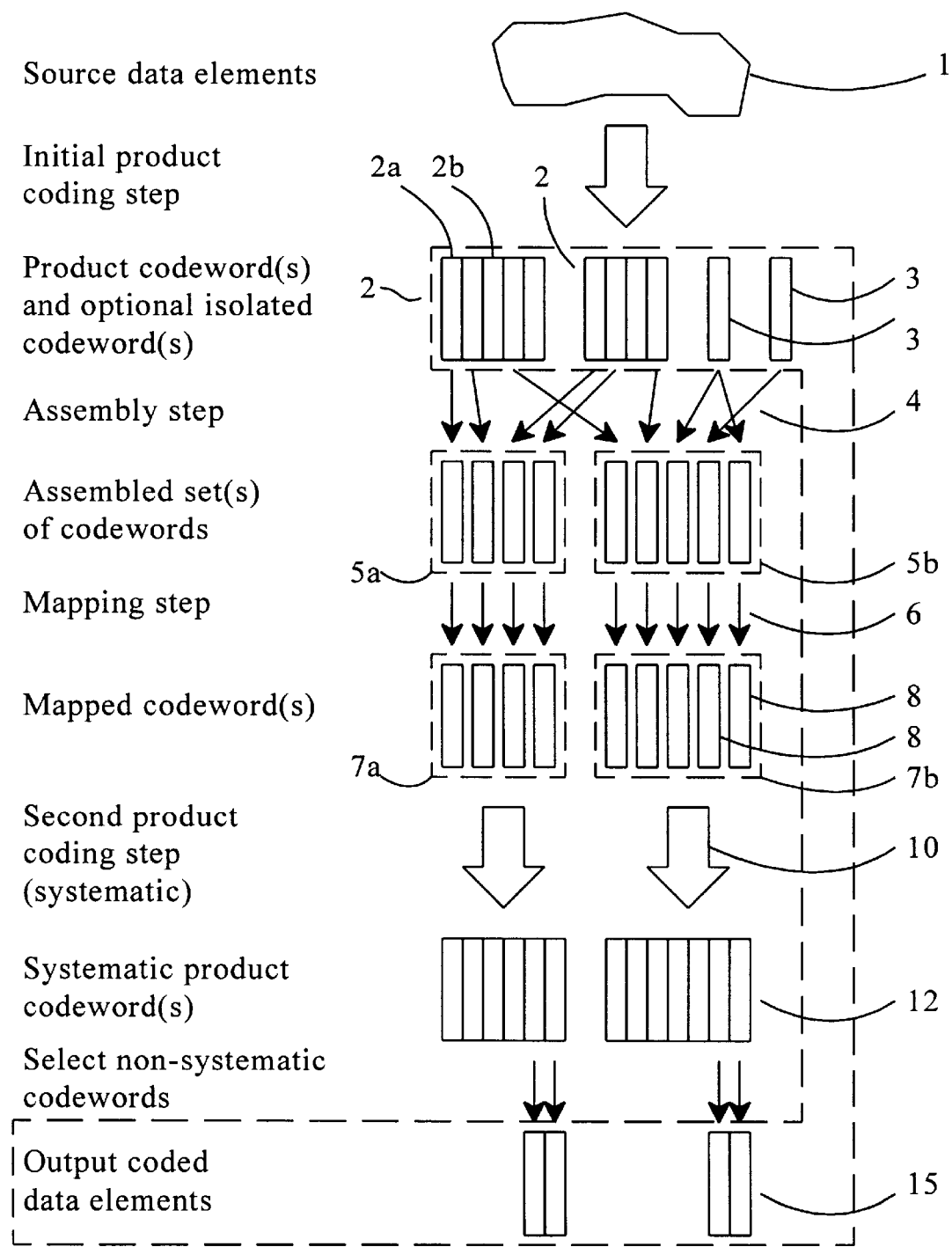

Referring to FIGS. 1 and 2, an exemplary method according to the invention is presented. The invention builds on prior art product coding techniques and, through further encoding, improves error correction capabilities. In order to improve error correction capabilities, an initial product coding step is followed by an assembly step, a mapping step, a second product coding step and a compilation of the encoded data.

In the initial product coding step source data elements 1 are coded using one or more product codes having a common component code. For example, the Golay (23,12) code is a component code that is common to the two binary product codes: "Golay (23,12)×Hamming (7,4)" and "convolutional (rate ½, $g_1$=133, $g_2$=171)×Golay (23,12)". The encoded data elements are provided as one or more primary product codewords 2. Each of the primary product codewords 2 consists of multiple first codewords 2a, 2b of the common component code. This is a direct consequence of the properties of product codes. Product coding is well known in the art.

During the assembly step, one or more first sets 5a, 5b of codewords of the common component code, which include first codewords 2a, 2b and optionally include isolated codewords 3, are assembled. Each of the first sets 5a, 5b comprises two or more distinct first codewords 2a selected from a same primary product codeword 2.

Optionally, one or more first codewords is included in more than one first set 5a, 5b. Further optionally, one or more first codewords 2b is excluded from all first sets. It is also possible that a first codeword is included more than once in a first set.

The assembly step 4 is indicated by a group of arrows from the product codewords 2 and optional isolated codewords 3 to the assembled sets of codewords—the first sets 5a, 5b. The isolated codewords 3 are optionally provided by other sources (not shown).

The mapping step 6 is indicated by a group of straight arrows from the codewords within the first sets 5a, 5b to second codewords 8 within the second sets 7a, 7b. The mapping step is performed by codeword-mapping each of the codewords of each of the first sets 5a, 5b to a second codeword 8 of the common component code using a one-to-one codeword-mapping. A one-to-one codeword-mapping is a reversible mapping. One or more second sets 7a, 7b of second codewords 8 are produced. Each second set 7a, 7b corresponds to a first set 5a, 5b of codewords.

Codeword-mapping of each codeword of the first sets 5a and 5b comprises a step of re-ordering, according to a known interleaving pattern, the symbols within a codeword. Preferably, the codeword-mapping is performed by re-ordering the symbols within a codeword in one of the first sets 5a, 5b into a second codeword 8, directly.

Alternatively, a symbol-mapping step is performed either before re-ordering, after re-ordering, or both before and after re-ordering the symbols. For example, a step of symbol-mapping each symbol within a codeword in one of the first sets 5a, 5b according to a known one-to-one symbol-mapping, is optionally performed before the step of re-ordering.

The codeword-mapping step 6 is performed such that if all of the codewords of a first set 5a, 5b are from a same primary product codeword 2, then some codeword-mappings applied to the codewords of the first set 5a, 5b are different, and if two or more repetitions of a same codeword 2a, 3 are included in a single first set 5a, 5b, then the codeword-mappings applied to those repetitions are different.

The identity mapping is a valid mapping. Some other examples of valid mappings are set out below. A cyclic rotation followed by scalar multiplication (the scalar not being zero) of a codeword of a linear cyclic code with symbols from some field is a valid mapping for such a code. Any fixed interleaver of a set of bits known to have even parity is a valid mapping for such a code. Any fixed cyclic shift followed by addition of a fixed codeword to a codeword of a (23,12) Golay code, in its cyclic representation, is a valid mapping for such a code.

In order to improve error correcting potential, it is preferable to select the mappings of the codewords to maximise the effectiveness of the second product coding step. It has been found that careful specification of the mapping and assembly steps results in improved error correction capabilities of the present invention. Further information about specifying effective codeword-mappings is presented in A. Hunt, S. Crozier, D. Falconer, "Hyper-codes: High-performance low-complexity error-correcting codes", *Proceedings, 19th Biennial Symposium on Communications* (Kingston, Canada, June 1998), pp. 263–267 and A. Hunt, *Hyper-codes: High-performance low-complexity error-correcting codes*, Master's thesis, Carleton University, Ottawa, Canada, May 1998. These references are incorporated herein by reference.

During the second product coding step 10, each second set 7a, 7b of second codewords 8 is coded using a systematic code so as to generate a secondary product codeword 12 for a product code having as component codes the common component code and the systematic code. The systematic code applied to each second set 7a, 7b of second codewords 8 need not be the same.

Once one or more secondary product codewords are generated, encoded output data is provided. The encoded output data comprises the primary product codewords 2 and the non-systematic portion 15 of the secondary product codewords. Optionally, the encoded output data also comprises the isolated codewords 3. Because the non-systematic portion 15 of the secondary product codewords are separable from the initial product codewords 2, the present invention provides a simple method for incrementally improving the error correcting potential of an encoding/decoding system. Though the second coding step is systematic, the overall coding process is not necessarily systematic, since the initial product coding step is optionally non-systematic.

The output data according to the method of the invention, is useful as input data for use in the steps of assembly 4, mapping 6, second product coding 10 and so forth. Essentially, the method of the invention is used to provide the initial product coding step; however, the method according to the invention further generates codewords 15 which are optionally provided as isolated codewords 3 for use in a subsequent assembly step 4.

Beneficially, the present method often results in a code having improved error correction capabilities for a given amount of information and a given code rate.

Simple Example

As a very simple example of the invention, consider an initial product coding step that produces a single codeword of a two-dimensional product code, which composed of two binary component codes that are both even-parity codes of length 3. Such a codeword is depicted below. The numbers are column indices, starting at 0.

0 1 2
0 1 2
0 1 2

The horizontal even-parity code serves as the "common component code" for this example. The steps of assembling, mapping, and second product coding are performed as shown below, producing three extra bits {a b c}. In this example, each codeword-mapping is simply a re-ordering of the symbols making up the codeword. The second product coding step uses an even-parity code of length 4 as the systematic code.

| 0 1 2 | 0 1 2 |
| 0 1 2 | 1 2 0 |
| 0 1 2 | 2 0 1 |
| | a b c <– Will have even parity. |

The extra three bits {a b c} produced by the second product coding step form a three-bit even-parity set; that is, they form a codeword of the common component code. Further, the extra three bits {a b c} provide parity relating to other constraints—relating the four-bit even-parity sets. This additional parity improves the error correction capabilities of the resulting code.

Alternative Embodiments

According to another embodiment, the above method is applied in an iterative manner. The output data produced by the above method in one iteration is used as an input to the assembly step 4 of a subsequent iteration. The non-systematic portion 15 of the secondary product codewords are provided as isolated codewords 3 for use in the assembly step 4. As such, the method becomes iterative and may be repeated any number of times. By carefully selecting different mappings a plurality of non-systematic portions of the secondary product codewords is determined each providing additional error correction capability.

In an embodiment the common component code is a cyclic code, and at least one of the codeword-mappings used in the mapping step 6 is performed using a cyclic shift of the codeword. This method of mapping the codeword is known to produce another codeword. This follows from the cyclic nature of the common component code. Often, when the common component code is a cyclic code, all mappings are performed using cyclic shifts. Preferably, when two or more codewords from a same primary product codeword are assembled into a same first set and are mapped using cyclic shifts, the shift amounts differ so as to improve the effectiveness of the second product coding step. The present embodiment is also applicable when the common component code is a quasi-cyclic code, provided that cyclic shifting results in a valid codeword.

Alternatively, when the common component code is a product code having a component code that is a cyclic code, the step of codeword-mapping comprises a step of rolling along a dimension associated with a cyclic component code. The rolling, or one-dimensional cyclic rotation, of a codeword of the common component code results in another codeword of the common component code because of the cyclic nature of the component code associated with the dimension of rolling. Preferably, when two or more codewords are from a same primary product codeword, are assembled into a same first set, and are mapped using rolling, the roll amounts along a same dimension differ so as to improve the effectiveness of the second product coding step. The present embodiment is also applicable when the common component code is a product code having a component code that is a quasi-cyclic code, provided that rolling results in a valid codeword.

In an embodiment, the common component code is a sum-to-identity code. According to this embodiment, there are no restrictions on symbol re-ordering within the mapping step 6 because of the insensitivity of a sum-to-identity code to the ordering of the symbols making up a codeword. This additional flexibility in the selection and specification of mappings is useful for enhancing the effectiveness of the second product coding step. Also, sum-to-identity codes allow for simple encoding and decoding implementations.

Alternatively, when the common component code is a product code having a component code that is a sum-to-identity code, the mapping step 6 comprises a step of shuffling along a dimension associated with a sum-to-identity component code. Shuffling along a dimension associated with a sum-to-identity code produces another codeword of the common component code because of the above mentioned insensitivity of sum-to-identity codes to the ordering of the symbols within a codeword. Shuffling along more than one dimension associated with sum-to-identity component codes also results in a codeword of the common component code. Of course, both rolling and shuffling may be used together on a same product code where applicable.

In a preferred embodiment, each codeword 2a within the one or more primary product codes 2 is placed within one and only one first set 5a, 5b during the assembly step 4, and the common component code is a product code composed of component codes that are binary sum-to-identity codes. An example of encoding as such is described with reference to a two-dimensional array above using binary sum-to-identity codes—even parity codes.

Experimental Results

The error-correction capability of the invention far exceeds that of the generally known method of product coding. As an example of the performance that is achieved using the invention, in additive white Gaussian noise (AWGN), using quadrature phase-shift keying (QPSK) modulation, with a block size of 4096 information bits, and with a code rate of 0.79, a bit-error-rate (BER) of $10^{-5}$ is achievable at an $E_b/N_0$—the ratio of the energy per information bit to the noise power spectral density—of 3 dB, which is only 1 dB above the capacity limit for QPSK modulation. Additional error-rate performance results are presented in A. Hunt, S. Crozier, D. Falconer, "Hyper-codes: High-performance low-complexity error-correcting codes", *Proceedings, 19th Biennial Symposium on Communications* (Kingston, Canada, June 1998), pp. 263–267; and in S. Crozier, A. Hunt, K. Gracie, J. Lodge, "Performance and Complexity Comparison of Block Turbo-Codes, Hyper-Codes, and Tail-Biting Convolutional Codes", *Proceedings, 19th Biennial Symposium on Communications* (Kingston, Canada, June 1998), pp. 84–88; and in A. Hunt, *Hyper-codes: High-performance low-complexity error-correcting codes*, Master's thesis, Carleton University, Ottawa, Canada, May 1998. These references are incorporated herein by reference.

Decoding

Product codes are often efficiently and effectively decoded using a posteriori probability (APP) processing applied in an iterative manner. Prior art APP methods are similarly applicable, with appropriate customisation, to the decoding of data coded according to the present invention. The following references provide explanations of APP processing, and are incorporated herein by reference:

J. Lodge, P. Hoeher, and J. Hagenauer, "The decoding of multi-dimensional codes using separable MAP 'filters'", in *Proceedings, 16th Biennial Symposium on Communications* (Queen's University, Kingston, Canada, May 1992), pp. 343–346.

J. Lodge, R. Young, P. Hoeher, and J. Hagenauer, "Separable MAP 'filters' for the decoding of product and concatenated codes", in *Proceedings, IEEE International Conference on Communications* (ICC '93, Geneva, Switzerland, May 1993), pp. 1740–1745.

J. Erfanian, S. Pasupathy, G. Gulak, "Reduced complexity symbol detectors with parallel structures for ISI channels", *IEEE Trans. on Communications*, Vol. 42, No. 2/3/4, pp. 1661–1671, February/March/April 1994.

J. Hagenauer, E. Offer, and L. Papke, "Iterative decoding of binary block and convolutional codes", *IEEE Transactions on Information Theory*, Vol. 42, No. 2, pp. 429–445, March 1996.

A novel method of max-log-APP processing is described in Applicant's co-pending application as referenced above and incorporated herein by reference. The novel method, with appropriate customisation, is applicable to decoding codes encoded according to the present invention.

As used herein, APP processing includes equivalent forms of processing and approximate forms of processing such as log-APP processing, where the processing occurs within the log domain; and max-log-APP processing where log-APP processing is simplified by one or more applications of the approximation $\log_b(b^x+b^y) \sim \max(x,y)$. Optionally, the log-probability quantities used in the above decoding processes are log-likelihood ratios (LLRs).

Numerous other embodiments may be envisioned without departing from the spirit or scope of the invention.

What is claimed is:

1. A method of error-correction coding of source data elements, comprising the steps of:
   (a) coding the source data elements using one or more product codes having a common component code, to provide one or more primary product codewords, each of the primary product codewords consisting of a plurality of first codewords of the common component code;
   (b) assembling one or more first sets of codewords of the common component code, each of said first sets comprising two or more distinct first codewords forming part of a same primary product codeword;
   (c) codeword-mapping each of the codewords of each of the first sets to a second codeword of the common component code using a one-to-one codeword-mapping to provide one or more second sets of second codewords, each second set corresponding to a first set of codewords, codeword-mappings of each codeword of a first set including the step of:
      (i) re-ordering, according to a known interleaving pattern, the symbols within a codeword,
   the codeword-mappings being such that if all of the codewords of a first set are from a same primary product codeword, then some codeword-mappings applied to the codewords of the first set are different, and if two or more repetitions of a same codeword are included in a single first set, then the codeword-mappings applied to those repetitions are different;
   (d) coding each set of second codewords using a systematic code so as to generate a secondary product codeword for a product code having as component codes the common component code and the systematic code; and,
   (e) providing encoded output data comprising the primary product codewords and the non-systematic portion of the secondary product codewords.

2. A method of error-correction coding of source data elements as defined in claim 1, comprising the step of iterating steps (b) through (e), wherein the one or more primary product codewords for a subsequent iteration are the one or more primary product codewords provided in step (e) of a previous iteration, and the non-systematic portion of the secondary product codewords provided in step (e) of a previous iteration is provided as isolated codewords for use in the subsequent iteration.

3. A method of error-correction coding of source data elements as defined in claim 1, wherein the common component code is a cyclic code, and wherein, for at least one of the codeword-mappings used in step (c), the step of re-ordering the symbols within a codeword is performed using a cyclic shift of the codeword.

4. A method of error-correction coding of source data elements as defined in claim 3, wherein each codeword of a first set and from a same primary product codeword is codeword-mapped using a step of re-ordering according to a cyclic shift different from a cyclic shift used in codeword-mapping each other codeword of said first set and from said primary product codeword.

5. A method of error-correction coding of source data elements as defined in claim 1, wherein the common component code is a product code, at least one component code of which being a cyclic code, and wherein, for at least one of the codeword-mappings used in step (c), the step of re-ordering comprises a step of rolling along a dimension associated with a cyclic component code.

6. A method of error-correction coding of source data elements as defined in claim 5, wherein each of the codeword-mappings of codewords of a first set and from a same primary product codeword comprises rolling the codeword along a dimension according to a roll amount different from that used for rolling each other codeword of said first set and from said primary product codeword along a same dimension.

7. A method of error-correction coding of source data elements as defined in claim 1, wherein the common component code is a quasi-cyclic code, and wherein, for at least one of the codeword-mappings used in step (c), the step of re-ordering the symbols within a codeword is performed using a cyclic shift of the codeword, said cyclic shift producing a codeword of the common component code.

8. A method of error-correction coding of source data elements as defined in claim 7, wherein each codeword of a first set and from a same primary product codeword is codeword-mapped using a codeword-mapping that re-orders the symbols of said codeword according to a cyclic shift different from that used for codeword-mapping each other codeword of said first set and from said primary product codeword.

9. A method of error-correction coding of source data elements as defined in claim 1, wherein the common component code is a product code, at least one component code of which being a quasi-cyclic code, and wherein, for at least one of the codeword-mappings used in step (c), the step of re-ordering comprises a step of rolling along a dimension associated with a quasi-cyclic component code, said rolling producing a codeword of the common component code.

10. A method of error-correction coding of source data elements as defined in claim 9, wherein each of the codeword-mappings of codewords of a first set and from a same primary product codeword comprises rolling the codeword along a dimension according to a roll amount different from that used for rolling each other codeword of said first set and from said primary product codeword along a same rolling dimension.

11. A method of error-correction coding of source data elements as defined in claim 1, wherein the common component code is a sum-to-identity code.

12. A method of error-correction coding of source data elements as defined in claim 1, wherein the common component code is a product code, at least one component code of which being a sum-to-identity code, and wherein the step of re-ordering comprises a step of shuffling along a dimension associated with a component code that is a sum-to-identity code.

13. A method of error-correction coding of source data elements as defined in claim 1, wherein the common component code is a product code composed of component codes that are binary sum-to-identity codes, and wherein each codeword in the primary product codewords is within only one first set.

14. A method of error-correction coding of source data elements as defined in claim 1, comprising the step of:
   (f) decoding received data elements representing encoded output data, wherein said decoding method comprises an iterative decoding procedure comprising the steps of:
   (i) decoding using a posteriori probability (APP) processing the received data using constraints determined in step (a); and
   (ii) decoding using a posteriori probability (APP) processing the received data using constraints determined in steps (b) through (e).

15. A method of error-correction coding of source data elements as defined in claim 1, wherein the codeword-mapping step comprises a step of symbol-mapping.

16. A method for decoding received data elements representing source data elements coded according to the coding method of claim 1, wherein said decoding method comprises an iterative decoding procedure comprising the steps of:

(i) decoding using a posteriori probability (APP) processing the received data using constraints determined in step (a); and (ii) decoding using a posteriori probability (APP) processing the received data using constraints determined in steps (b) through (e).

17. A method according to claim 16, wherein the APP processing is log-APP processing.

18. A method according to claim 17, wherein the log-APP processing is max-log-APP processing.

19. A method according to claim 18, wherein the common component code is a binary sum-to-identity code, and log-probability quantities used in the decoding process are log-likelihood ratios (LLRs).

20. A method according to claim 18, wherein the common component code is a product code composed of component codes that are binary sum-to-identity codes, and log-probability quantities used in the decoding process are log-likelihood ratios (LLRs).

* * * * *

UNITED STATES PATENT AND TRADEMARK OFFICE
CERTIFICATE OF CORRECTION

PATENT NO.   : 6,145,111
DATED        : November 7, 2000
INVENTOR(S)  : Crozier et al.

It is certified that error appears in the above-identified patent and that said Letters Patent is hereby corrected as shown below:

Column 1,
Line 31, "{1 $\beta$ $\beta^2$ $\beta^3$}" should read -- {1 $\beta$ $\beta^2$ $\beta^3$} --.

Column 2,
Line 45, "the bits is" should read -- the bits are --.

Column 9,
Lines 25 to 31, should be indented to match indent of line 22.

Signed and Sealed this

Sixth Day of November, 2001

Attest:

*Nicholas P. Godici*

NICHOLAS P. GODICI
*Attesting Officer*   *Acting Director of the United States Patent and Trademark Office*